United States Patent
Maruyama et al.

[11] Patent Number: 5,769,236
[45] Date of Patent: Jun. 23, 1998

[54] COMPONENT COLLECTIVE AND COMPONENT COLLECTIVE FEEDING APPARATUS

[75] Inventors: Yoshio Maruyama, Kyoto; Shinji Kadoriku, Takarazuka; Toshiaki Yamauchi, Yawata; Shoriki Narita, Kadoma; Naomi Kuromoto; Hiroshi Yamauchi, both of Hirakata, all of Japan

[73] Assignee: Matsushita Electric Industrial Co., Ltd., Osaka-fu, Japan

[21] Appl. No.: 504,654

[22] Filed: Jul. 20, 1995

[30]     Foreign Application Priority Data

Jul. 20, 1994  [JP]  Japan ................................ 6-167799

[51] Int. Cl.⁶ .............................................. B65D 85/86
[52] U.S. Cl. ............................................ 206/714; 206/713
[58] Field of Search ........................ 206/701, 713–717, 206/820

[56]              References Cited
              U.S. PATENT DOCUMENTS

| 4,867,308 | 9/1989 | Crawford et al. ............... 206/714 |
| 5,234,104 | 8/1993 | Schulte et al. ............... 206/714 |
| 5,265,723 | 11/1993 | Chenoweth et al. ............. 206/714 |
| 5,333,733 | 8/1994 | Murata ....................... 206/714 |
| 5,361,901 | 11/1994 | Schenz et al. ................ 206/714 |

FOREIGN PATENT DOCUMENTS 3-212368  9/1991  Japan ................................. 206/330

*Primary Examiner*—Jimmy G. Foster
*Attorney, Agent, or Firm*—Wenderoth, Lind & Ponack

[57]                 ABSTRACT

A component collective includes component holders respectively holding components therein and connected to one another in the form of a tape carrier. Each of holders is provided with a cavity to accommodate the component, a lid for shutting an opening of the cavity, and a keeping device for keeping the lid at a closed position. An apparatus for feeding the component collective includes a device for transferring the component collective, a device for forcibly opening the lid means of the component holder transferred to a predetermined position, and a device for forcibly closing the lid of the component holder after a component is removed from the cavity.

19 Claims, 13 Drawing Sheets

COMPONENT COLLECTIVE AND COMPONENT COLLECTIVE FEEDING APPARATUS

BACKGROUND OF THE INVENTION

The present invention relates to a component collective of many electronic components or mechanical components accommodated in a tape-like carrier and a feeding apparatus for feeding the component collective.

In a widely known component collective of the prior art, components are accommodated in storage cells of a carrier tape and a cover tape is bonded to the carrier tape. The components are thus sealed and held within the carrier tape.

The cover tape is detached from the carrier tape when the inside components are to be used. Since the separated cover tape is not recyclable, the prior art is contrary to the current trend toward saving resources and rather causes an increase of costs. What's worse, the prior art needs a winding reel for winding up the separated cover tape, thereby requiring a feeding apparatus for feeding the component collective to be complicated in structure.

SUMMARY OF THE INVENTION

The object of the present invention is therefore to provide a component collective wherein, similar to a conventional component collective covered with a cover tape, components are sealed to be protected against flaws and dust.

A further object of the present invention is to provide an apparatus suitable to feed the above component collective.

In accomplishing these and other aspects, according to one aspect of the present invention, there is provided a component collective comprising component holders respectively holding components therein and connected to one another in the form of a tape carrier. Each of the component holders is provided with a cavity to accommodate the component, a lid for shutting an opening of the cavity, and a keeping device for keeping the lid at a closed position.

According to another aspect of the present invention, there is provided a feeding apparatus for feeding a component collective which comprises component holders respectively holding components therein and connected the one another in the form of a tape carrier. Each of the component holders is provided with a cavity to accommodate the component, a lid for shutting an opening of the cavity, and a keeping device for keeping the lid at a closed position.

The apparatus comprises:

a means for transferring the component collective;

a for forcibly opening a lid means of a component holder transferred to a predetermined position; and a for forcibly closing the lid means of the component holder after a component is removed.

The component collective of the present invention is produced by accommodating components in cavities of component holders while a lid of each component holder is opened, and then closing the lid. Loading of the components at this time is easily automated.

Since the component collective with components loaded therein is in the form of a tape, the component collective can be preserved or transported compactly, for example, in a state where it is wound around a reel. The lid kept at the closed position by the keeping device surely holds the components inside the cavities, thereby preventing the components from being flawed or damaged by dust.

In supplying components to an electronic component mounting apparatus, the component collective of components can be provided in the compact state, e.g., in the state wound around a reel, to the component collective feeding apparatus installed in the mounting apparatus. The opening means for opening the lid at the take-out position is simpler and more compact in structure than a cover tape detaching means in the conventional example. The components in the cavities can be removed at the take-out position while the lid is open, and supplied to a working tool of the mounting apparatus, etc. The lid is designed to be forcibly closed after the component is removed. The emptied tape can be taken back to the reel and prepared in a compact state for its next use. Since it is not necessary to separate the cover tape in the component collective of the present invention, not unlike the prior art, the component collective is never damaged and is reusable.

The component collective feeding apparatus of the present invention is provided with means for transferring the component collective, means for forcibly opening the lid, and means for forcibly closing the lid. The apparatus smoothly feeds the component collective having the above-described merits to a predetermined position.

BRIEF DESCRIPTION OF THE DRAWINGS

These and other objects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
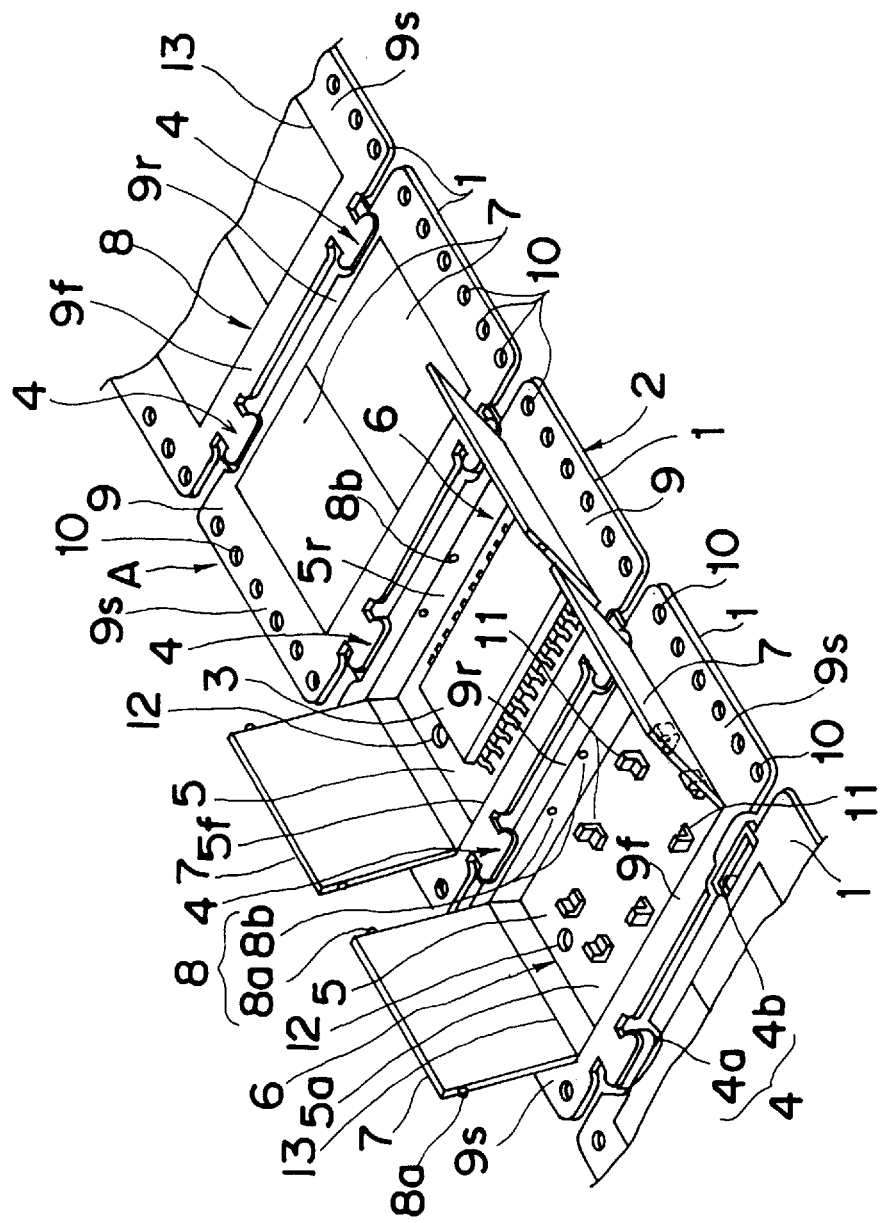
FIG. 1 is a perspective view of a component collective in a first embodiment of the present invention.

Before the description of the present invention proceeds, it is to be noted that like parts are designated by like reference numerals throughout the accompanying drawings.

A first embodiment of the present invention will be described with reference to FIGS. 1–7, 17A, 17B, and 20.

Figure 2:
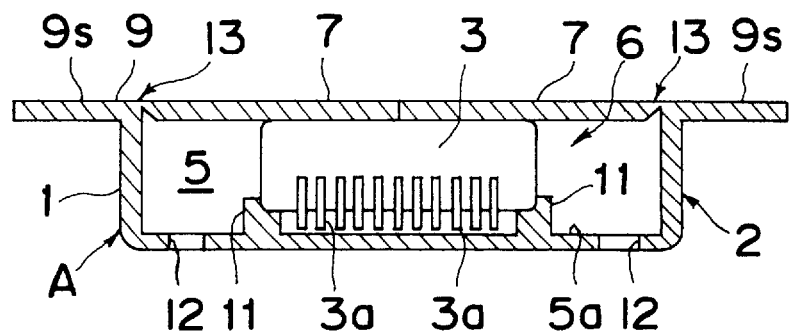
FIG. 2 is a lateral sectional view of the component collective of FIG. 1.
Figure 3:
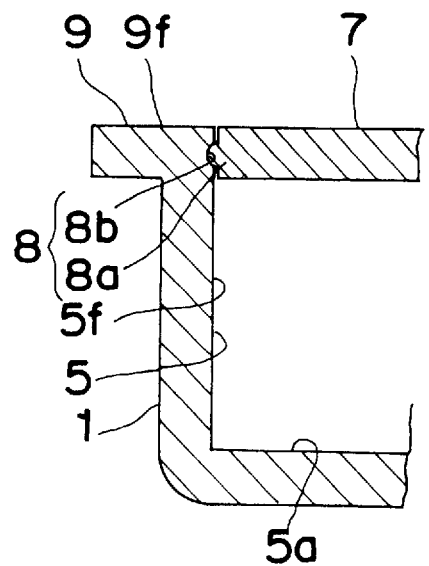
FIG. 3 is a longitudinal sectional view of a part of the component collective.

As shown in FIGS. 1–3, a component collective A of the embodiment comprises a tape carrier 2 formed by connecting many component holders 1 to each other. Each component holder 1 integrally molded by resin accommodates a component 3. The component holders 1 are connected to each other at the projecting/recessed coupling parts 4.

The component holder 1 has a component holding cavity 5 for holding the component 3 therein, a pair of lids 7 which open outward and which shut an opening 6 of the cavity 5, and a closed position keeping means 8 for keeping each of the lids 7 at the closed position.

At a flange 9, more specifically, at the right and left extensions 9s of the flange 9 in the periphery of an upper edge of the cavity 5 of each component holder 1, there are opened feed holes 10. The feed holes 10 are formed at equal intervals over the whole tape carrier 2. At a front extension 9f and a rear extension 9r of the flange 9 are formed coupling projections 4a and coupling holes 4b for fitting the coupling projections 4a therein, respectively. The coupling projections 4a and the coupling holes 4b constitute the above-mentioned projecting/recessed coupling part 4. The component holders 1 are connected to one another by forcibly fitting the coupling projections 4a of the rear component holder 1 into the coupling holes 4b of the front component holder 1. That is, as shown FIGS. 17A and 17B, the projection 4a is formed in V-shape and when the projection 4a is inserted and fitted into the hole 4b with some pressure, a claw portion 4c of the projection 4a is, first, elastically deformed. After the claw portion 4c of the projection 4a is fitted into the hole 4b while, firstly, elastically deformed, the claw portion 4c is returned to its original V-shape by its elastic force as show in FIG. 17B. After the projection 4a is fitted into the hole 4b, even when any tensile force is applied to the tape carrier 2, a base portion 4h of the claw portion 4c contacts with an inner wall 4i of the hole 4b so that the coupling of the projection 4a and the hole 4b withstands the tensile force. Even when any compressive force is applied to the tape carrier 2, a contact surface 4e of the projection 4a contacts with another inner surface 4d of the hole 4b so that the coupling of the projection 4a and the hole 4b withstands the compressive force. When the tape carrier 2 is wound around a reel or when the tape carrier 2 contacts guide rollers, a bending force is applied to the tape carrier 2. In this case, an upper surface 4g of an end of the claw portion 4c contacts with a lower surface 4f of the periphery of the hole 4b so that the surface 4f prevents the claw portion 4c from moving upward in FIG. 17B to withstand the bending force. The base portion 4j of the projection 4a can be bent. Especially, when the projection 4a and the hole 4b are made of a polypropylene resin, such a resin has a self-hinge function and thus the base portion 4j can be bent ten thousand through one million times.

A plurality of supporting projections 11 provided at a bottom 5a of the component holding cavity 5 support the component 3 in a regulated state and position, so that leads 3a of the component 3 are prevented from being directly in touch with the bottom 5a of the cavity 5, as is clear from FIG. 2. A rod insertion hole 12 is formed in the vicinity of each of the right and left end parts of the bottom 5a.

The opening 6 of the holding cavity 5 is covered with the right and left lids 7 in a manner to be freely opened/closed. The pair of lids 7 are symmetric to the center line in the longitudinal direction of the component collective A. A groove is notched at a part of the lid 7 adjacent to the extension 9s, thereby constituting a thin resin hinge portion 13.

As is shown in FIG. 2, when the right and left lids 7 are closed, the upper surfaces of the lids 7 are even with the upper surface of the flange 9 and the component 3 is held with some pressure between the lids 7 and the supporting projections 11. The closed position keeping means 8 holds the lids 7 in the closed state. That is, an engaging projection 8a at each lateral side face of the lid 7 is engaged with a corresponding engaging recess 8b at each of front and rear wall surfaces 5f, 5r of the holding cavity 5, thereby holding the lid 7 in the closed state. Although the lid keeping means 8 is made sufficiently resistive to the repulsive force from the component 3 held and pressed between the lids 7 and the supporting projections 11, it is adapted to allow the lids 7 to open when at least a certain amount of external force is applied to the lids 7.

Figure 7:
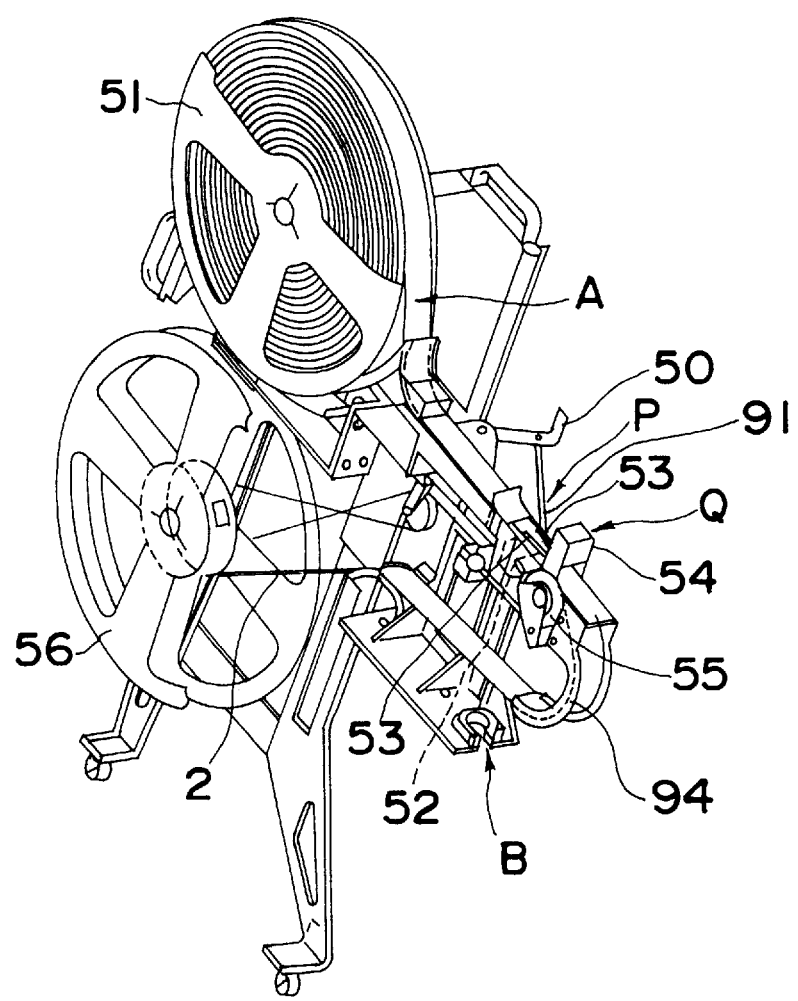
FIG. 7 is a perspective view of a component collective feeding apparatus according to an embodiment of the present invention.

The thus-constituted component collective A is wound around a reel 51 and set in a component collective feeding apparatus B to feed the components 3 to an electronic component mounting apparatus or the like, as indicated in FIG. 7.

Figure 4:
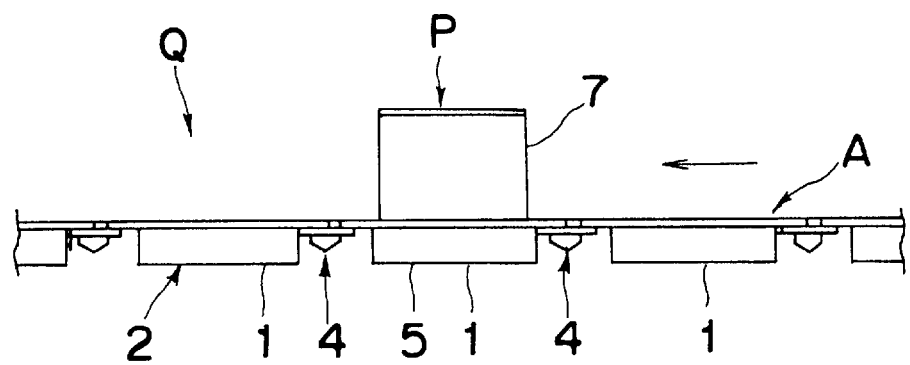
FIG. 4 is a schematic side view of the component collective.
Figure 20:
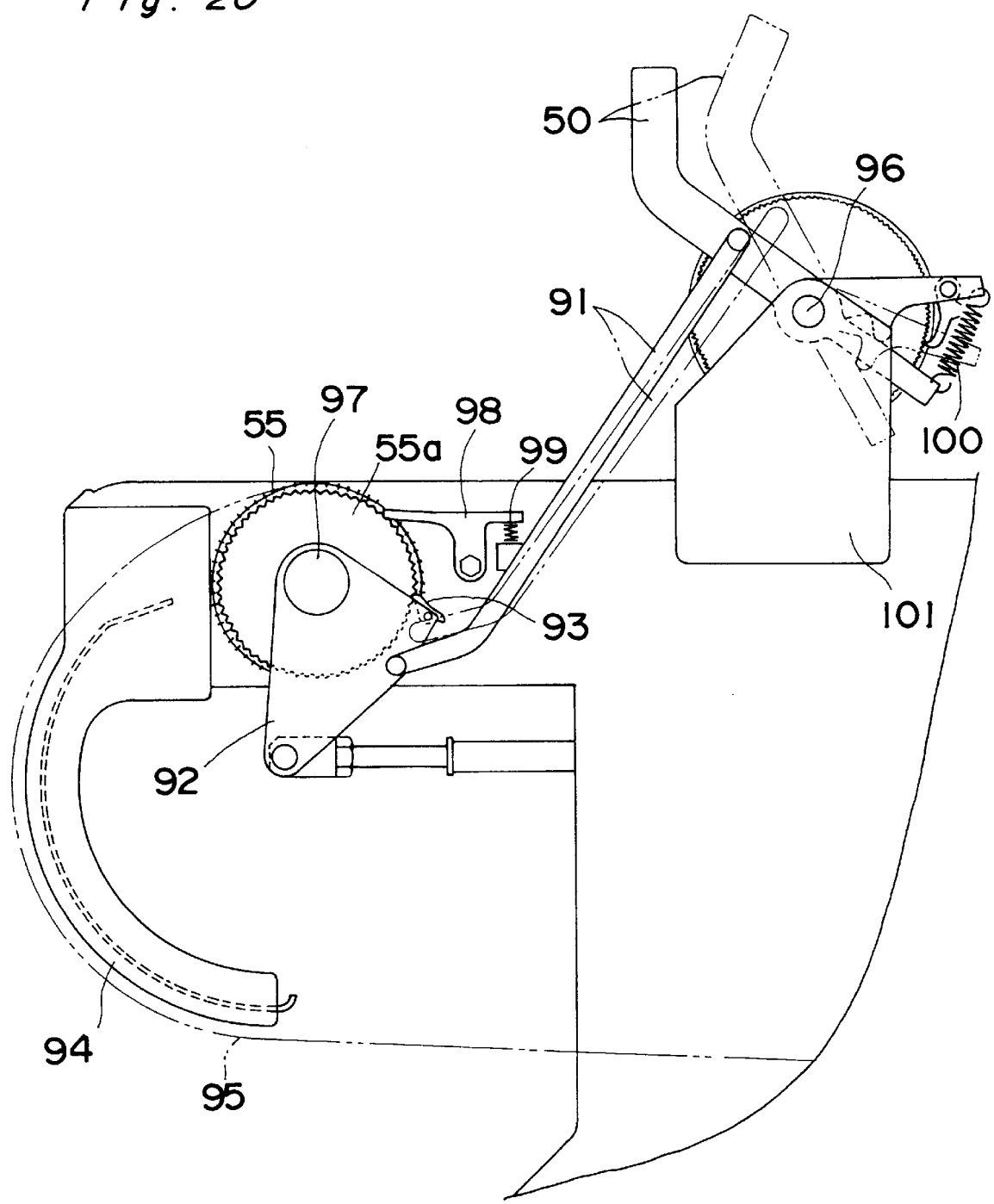
FIG. 20 is a side view of a mechanism for feeding the component collective in the first embodiment.

The component collective feeding apparatus B feeds and guides the component collective A from the reel 51 to a component take-out position P by the action of a lever 50 (referring to FIGS. 4 and 20). The feed holes 10 are utilized to move the component collective A at this time. That is, the feed holds 10 are engaged with a sprocket wheel 55. The lever 50 is capable of swinging around a shaft 96 and is connected to an upper end of a link 91. The lower end of the link 91 is connected to a triangle plate 92 swinging around a shaft 97. The plate 92 has a ratchet gear 93 for engaging a sprocket gear 55a of the sprocket wheel 55 to rotate in increments in one direction. Then, the lever 50 is swung, the sprocket gear 55a together with the sprocket wheel 55 is rotated via the link 91, the plate 92, and the ratchet gear 93, so that the component collective A is fed. That is, the tape carrier 2 is transferred along a curve of the sprocket wheel 55 and a curved guide member 94 in a direction 95 shown by a chain-dotted line. In FIG. 20, reference numeral 98 denotes a stopper for preventing the sprocket gear 55a from rotating in the opposite direction, 99 a spring for urging the stopper 98 to a position for engaging the stopper 98 with the sprocket gear 55a, 100 a spring for urging the lever 50 to its original position after the lever 50 is swung, and 101 a frame supporting the lever 50, sprocket wheel 55, etc. Since the operation to move the component collective A is the same as that of the known tape carrier and is well known, the detailed explanation will be abbreviated here.

Figure 5:
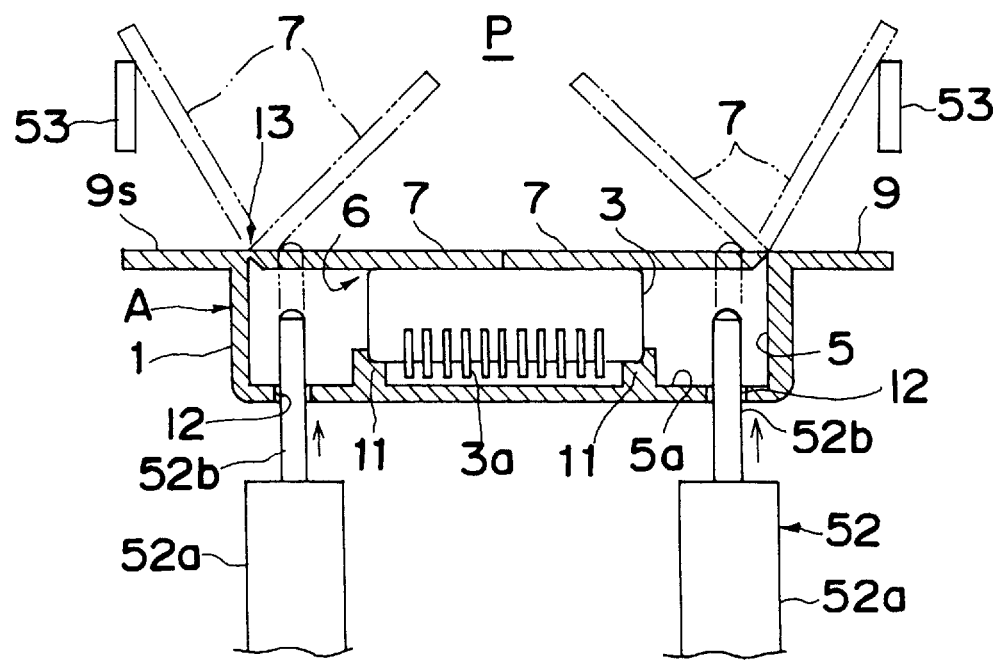
FIG. 5 is a lateral sectional view showing the operation when a lid means is opened.

Referring to FIG. 5, a lid opening means 52 with right and left air cylinders 52a is disposed below the component collective A at the take-out position P. A pair of right and left guides 53 of the apparatus B receive the opened lids 7 in the state inclined a predetermined angle outward. As is generally known, a component take-out device (not shown), for example, a suction nozzle head is placed at the remove position P to take out the component 3 from the holder 1.

The air cylinders 52a have push rods 52b which, passing through the rod insertion holes 12 of the holder 1, push upward and open the lids 7. The air cylinders 52a start to operate while the component holder 1 intermittently sent to the take-out position P stops at the position P. After the lids 7 are opened by the air cylinders 52a as indicated by virtual lines in FIG. 5, the push rods 52b are returned to below the component holder 1.

During this time, the component take-out device removes the component 3 from the holding cavity 5.

Figure 6:
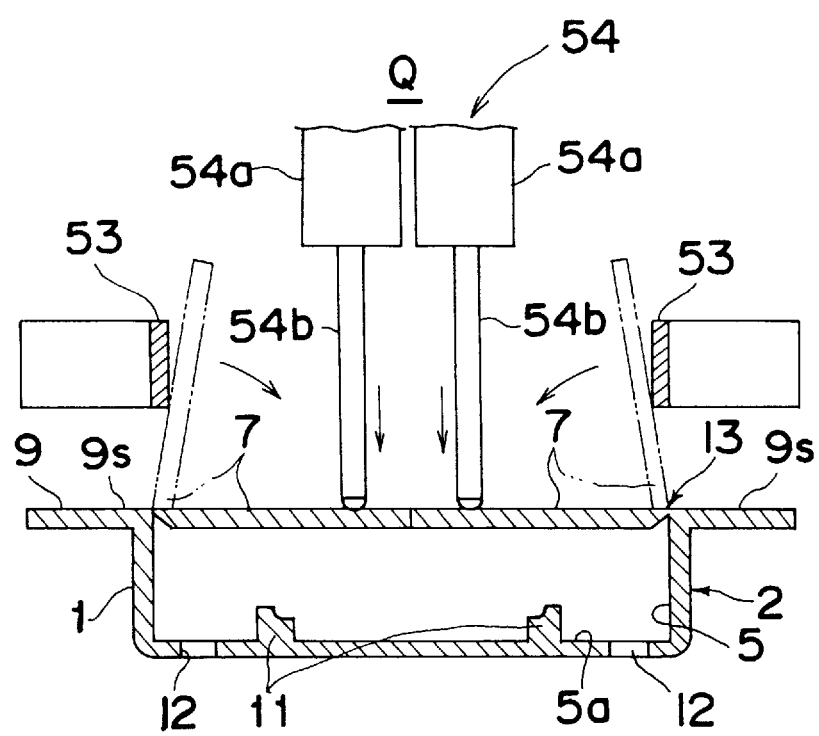
FIG. 6 is a lateral sectional view showing the operation when the lid means is closed.

The emptied component collective A without the components 3, i.e., the emptied tape carrier 2, is sent to a closing position Q. Immediately before the tape carrier 2 reaches the closing position Q, the pair of guides 53 extending from the take-out position P to the closing position Q turn the lids 7 inward as shown in FIG. 6, so that the lids 7 are closed by their own weight just before reaching the closing position Q. The distance of the right and left guides 53 is gradually narrowed as is clear in FIGS. 5–7.

A lid closing means 54 is arranged above the tape carrier 2 at the closing position Q as in FIG. 6. The lid closing means 54 has a pair of right and left air cylinders 54a. While the component holder 1, intermittently fed and sent to the closing position Q, stops at the position Q, the air cylinders 54a start operating and push rods 54b of the air cylinders 54a descend to further press the lids 7 which have just closed by their own weight. As a result, the engaging projections 8a are fitted in the engaging recesses 8b (referring to FIG. 3). Handling of the tape carrier 2 is smoothly conducted afterwards as the pair of lids 7 are forcibly closed in the above manner.

The tape carrier 2 is transferred along a curve of the sprocket wheel 55 and wound back around a wind reel 56 for recycling.

Figure 8:
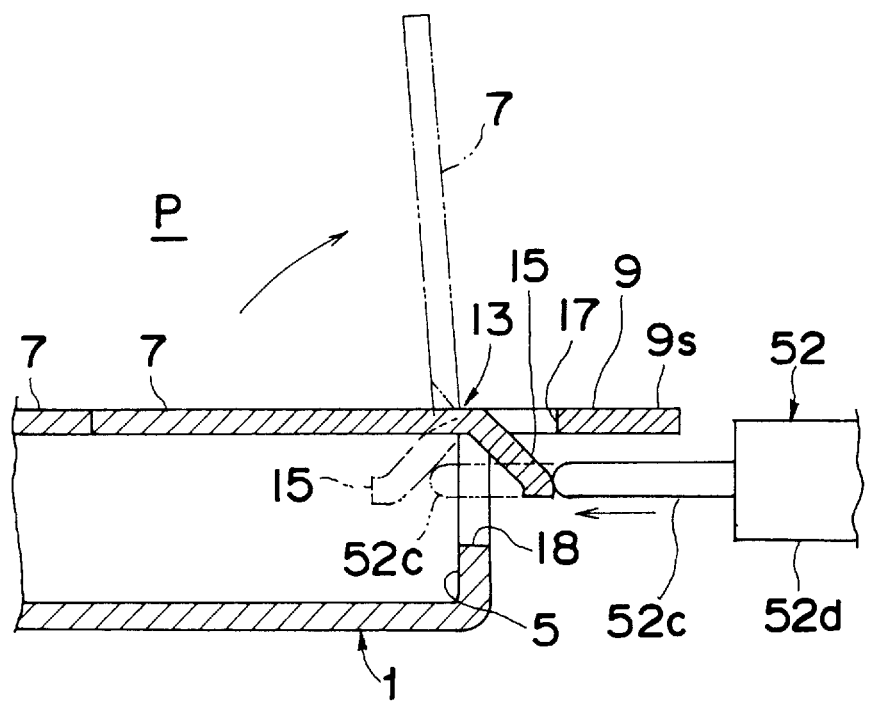
FIG. 8 is a lateral sectional view of a part of a component collective in a second embodiment of the present invention.
Figure 9:
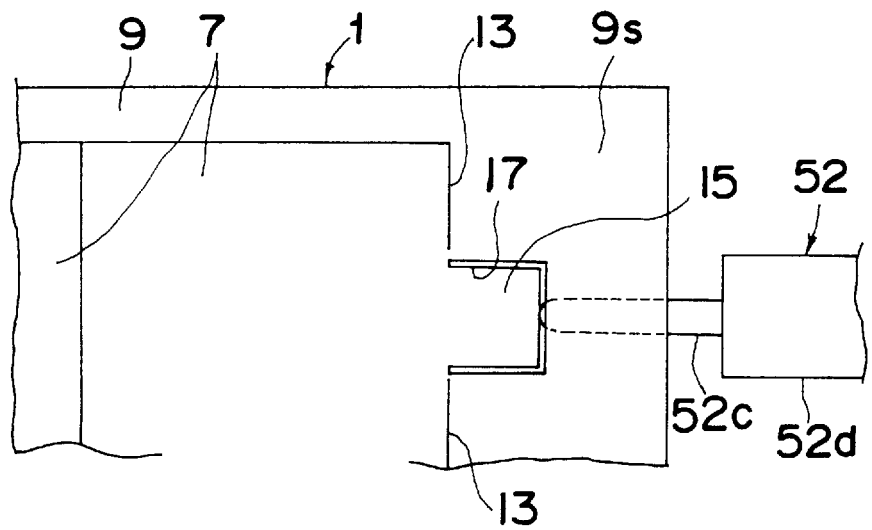
FIG. 9 is a plan view of FIG. 8.

A second embodiment of the present invention will be described with reference to FIGS. 8 and 9.

According to the second embodiment, an integral flap 15 is extended from the center of the hinge portion 13 of the lid 7. The lids 7 are opened with the use of the flaps 15. The lid opening means 52 at the take-out position P has an air cylinder 52d at each side of the component holder 1 as shown in FIG. 8. The air cylinder 52d opens the lid 7 when the flap 15 is pressed by its push rod 52c. A notch 17 at each extension 9s of the flange 9 and a notch 18 at each of the right and left wall surfaces of the component cavity 5 help the flap 15 and the push rod 52c to smoothly operate.

The second embodiment is characterized as above. Since the constitution of other parts is the same as in the first embodiment, the description will be abbreviated.

Figure 10:
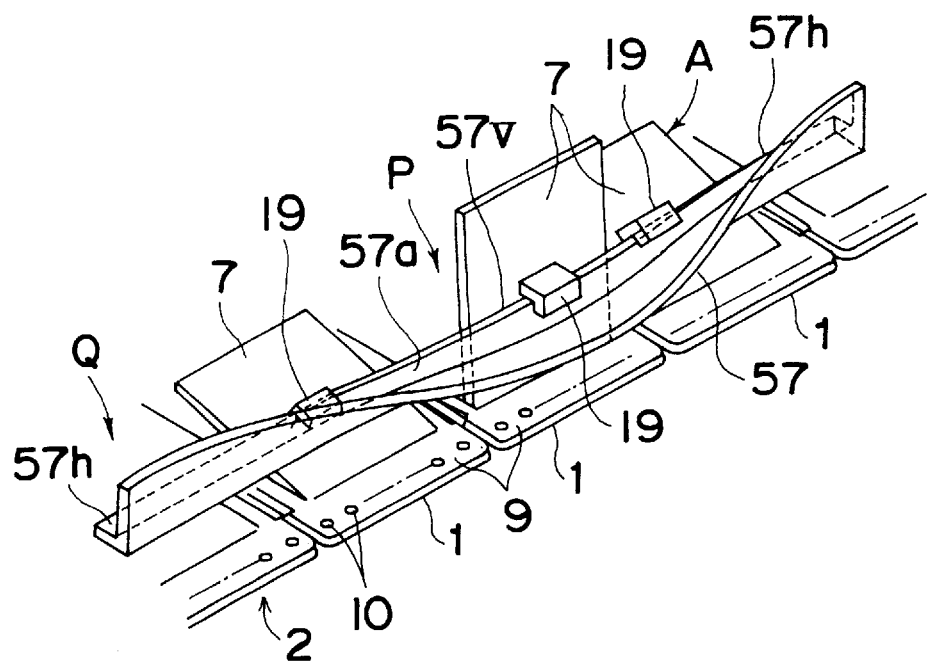
FIG. 10 is a perspective view of a component collective in a third embodiment of the present invention.

Now, a third embodiment of the present invention will be described with reference to FIG. 10.

The third embodiment features a guide projection 19 integrally formed on the upper surface of the lid 7. The projection 19 is utilized to open/close the lid 7 by force. A guide rail 57 extends from a position before to a position after the take-out position P.

The projection 19 is formed in the shape of an inverted L in cross section, with the outer side being open. On the other hand, the guide rail 57 has a guiding main body 57a to be engaged with the projection 19 and twists so that the guiding main body 57a changes gradually from a horizontal posture to a vertical posture and then from the vertical posture to the horizontal posture.

Each projection 19 is engaged with each horizontal part 57h of the guiding main body 57a considerably before reaching the take-out position P. During the time when the component holder 1 is transferred to the take-out position P, the lids 7 are gradually opened. The lids 7 are wide open approximately in the vertical direction so as to allow removal of the component 3 from the cavity 5 when the component holder 1 reaches the take-out position P. Although the projections 19 are engaged with vertical parts 57v of the guiding main body 57a at this time, the projections 19 gradually close the lids 7 as the component 3 is removed from the cavity 5 and the component holder 1 is sent to the closing position Q. When the component holder 1 comes to the closing position Q, the projections 19 are engaged with the horizontal parts 57h of the guiding main body 57a to thereby force the lids 7 to close.

The third embodiment does not require the rod insertion holes 12 provided in the first embodiment, nor the notches 17, 18 of the second embodiment, therefore enhancing the sealing properties inside the cavity 5 and effectively protecting the component 3 from dust or the like.

While the third embodiment is characterized in the above-described structure, other parts are constituted in the same manner as in the first and second embodiments, the description of which will be accordingly abbreviated here.

A fourth embodiment of the present invention will be made clear with reference to FIGS. 11–13. A first feature of the fourth embodiment is a pair of resin springs 8c constituting the keeping means 8. Because of the resin springs 8c, the lids 7 are automatically opened into a fully opened state O simply when the lids 7 move beyond a turning point T and to an opening state side, and automatically closed into a fully closed state C if the lids 7 are closed to a closed state side passing the turning point T.

Figure 11:
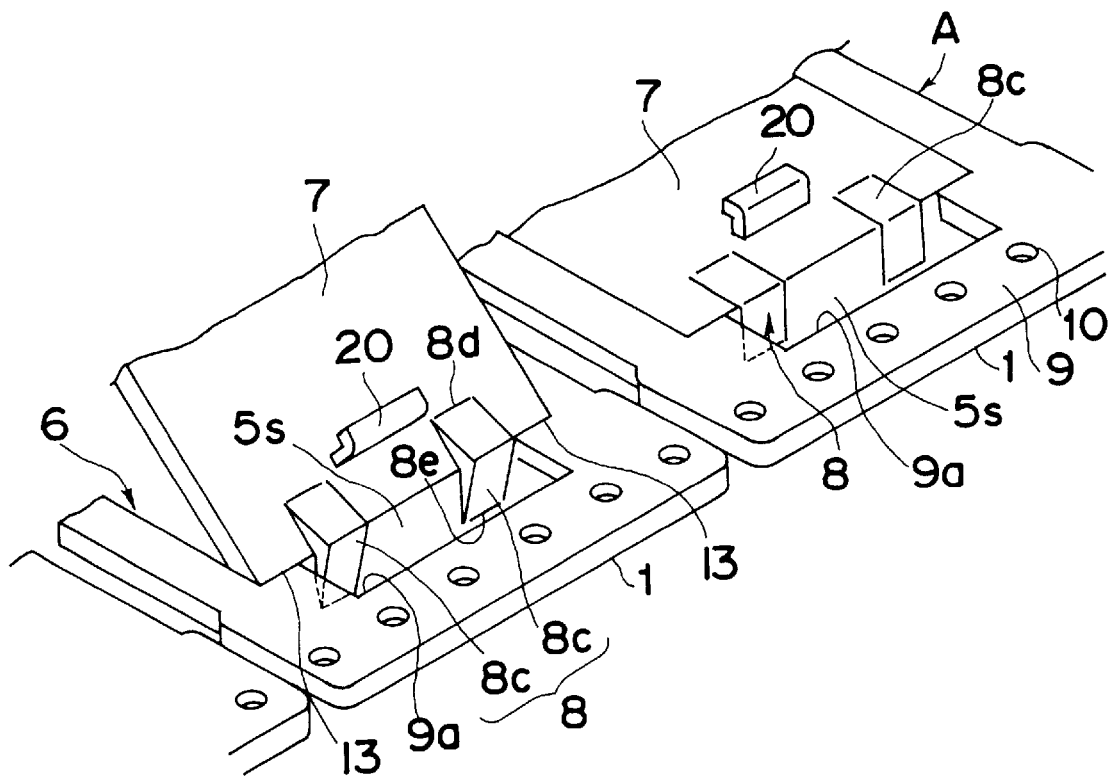
FIG. 11 is a perspective view of a part of a component collective in a fourth embodiment of the present invention.
Figure 12:
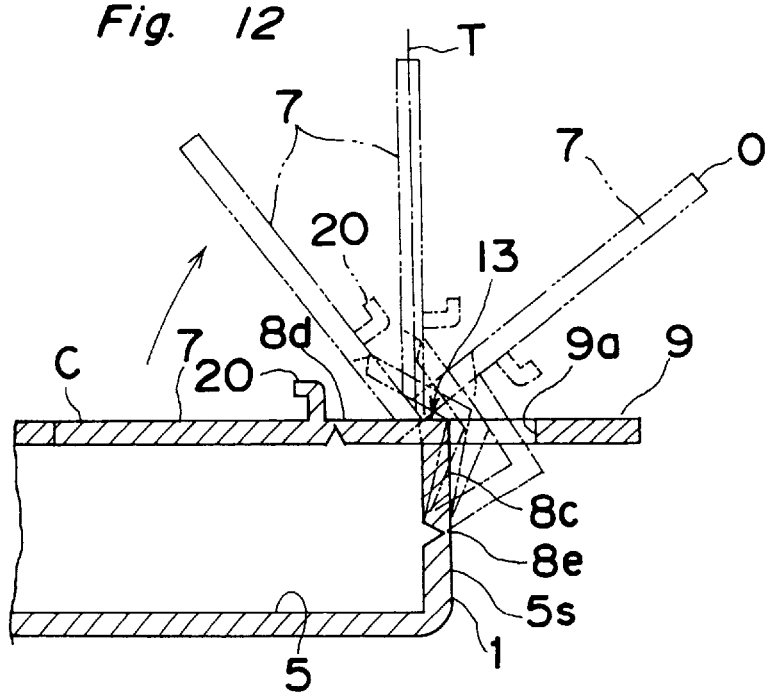
FIG. 12 is a lateral sectional view of FIG. 11.

In FIGS. 11 and 12, according to the fourth embodiment of the present invention, the pair of right and left resin springs 8c are integrally formed with the component holder 1 in a manner that a front end and a base end of each resin spring 8c are connected to the lid 7 via a thin resin hinge portion 8d and to an outside wall 5s of the cavity 5 via a thin resin hinge portion 8e, respectively. An opening 9a formed in the flange 9 prevents interference between the resin springs 8c and the holder 1. The hinge portion 13 of the lid 7 is located at either side of the pair of resin springs 8c.

The resin springs 8c cause the lids 7 to automatically open into the fully opened state O once the lids 7 are removed beyond the turning point T from the closed state. Moreover, the spring force of the resin springs 8c not only moves the lids 7 automatically into the perfectly closed state C when the lids 7 pass the turning point T from the opened position, but keeps the lids 7 positively in the perfectly closed state. The lid opening means 52 for the component collective A having the above characteristics can be that used in either of the first and second embodiments. When such opening means 52 is used, the stroke of the rods 52b, 52c of the air cylinders 52a, 52d can be shortened and at the same time, the guides 53 provided in the first embodiment suffice as the closing means 54. A special closing means is not required.

Figure 13:
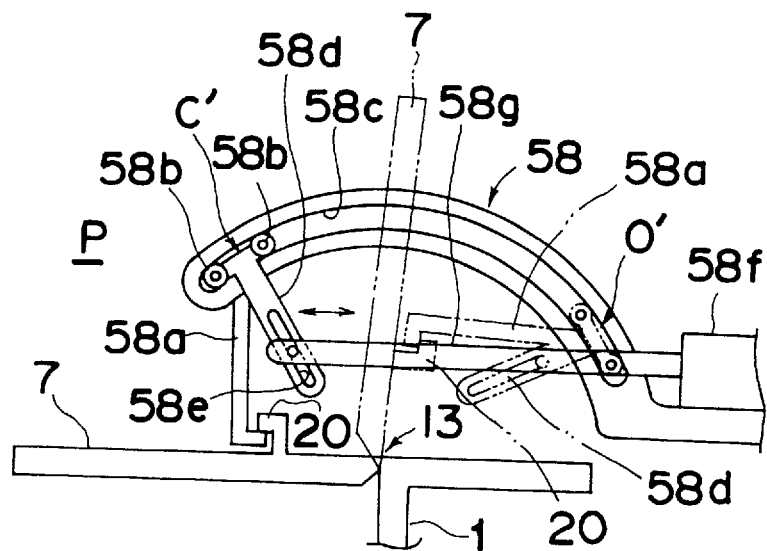
FIG. 13 is a diagram representing the opening/closing operation of a lid means of the component collective of FIG. 11.
Figure 14:
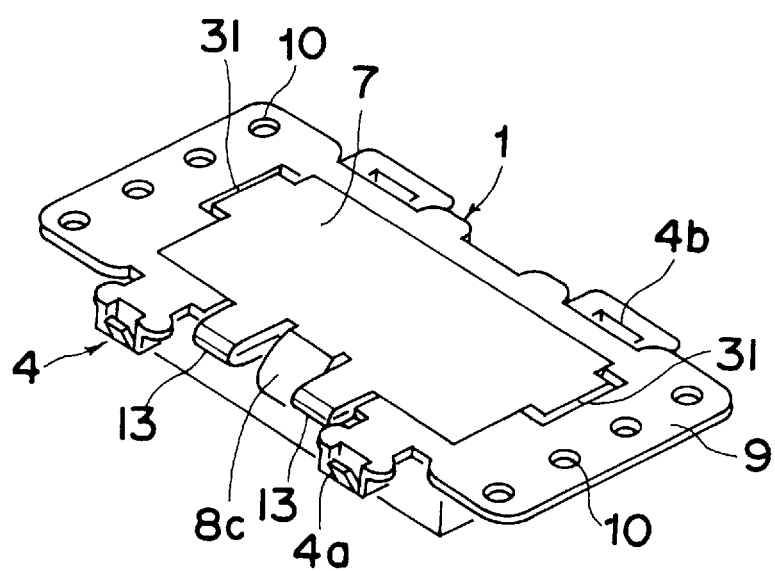
FIG. 14 is a perspective view indicating the closed state of a component collective in a fifth embodiment of the present invention.
Figure 15:
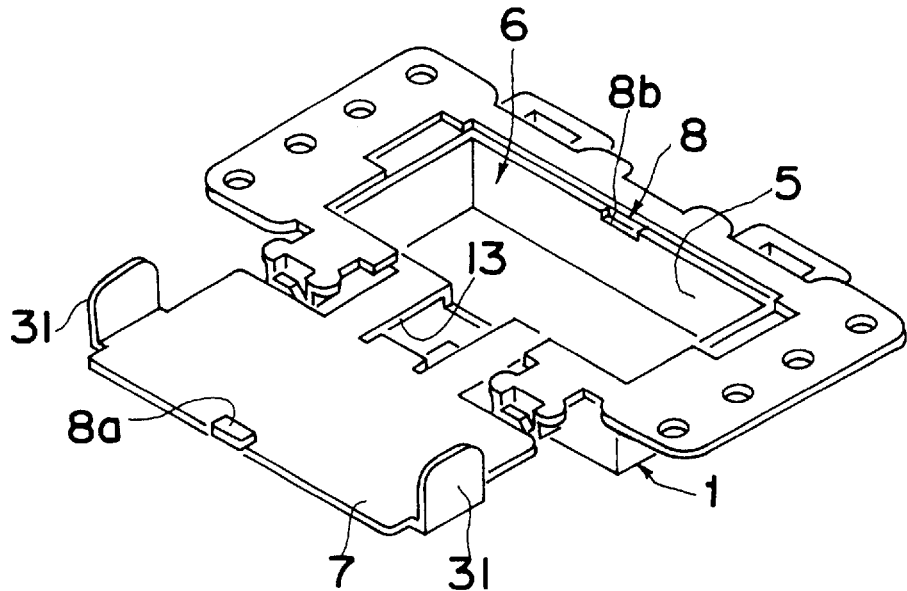
FIG. 15 is a perspective view of the opened state of the component collective in the fifth embodiment.
Figure 16:
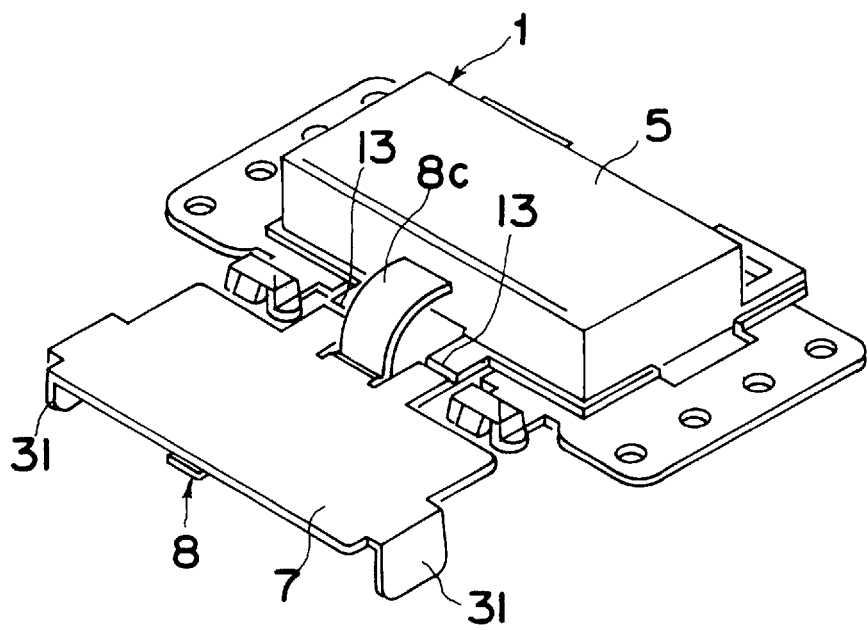
FIG. 16 is a perspective view of a state where a component holder in FIG. 15 is laid upside down.
Figure 17A:
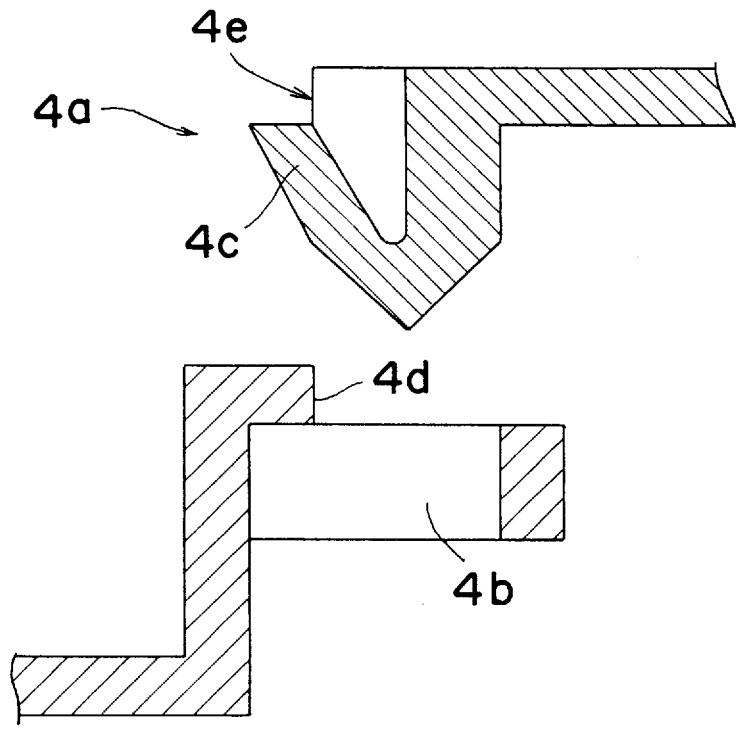
FIG. 17A is an enlarged sectional side view of a coupling projection and a coupling hole of the component collective in a state where the projection is not fitted into the hole.
Figure 17B:
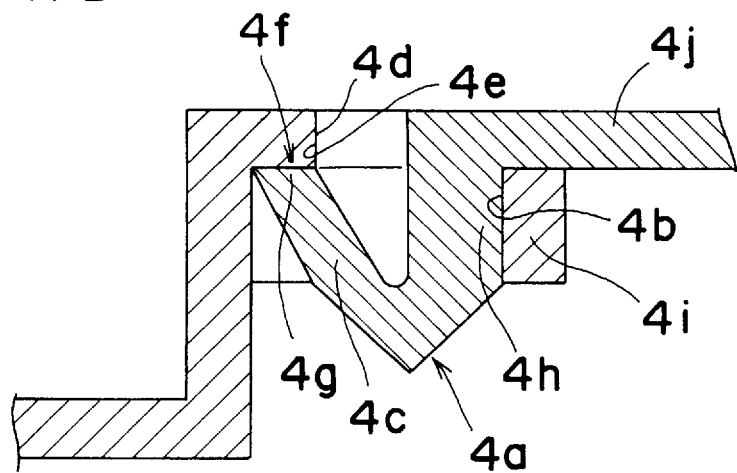
FIG. 17B is an enlarged sectional side view of the coupling projection and the coupling hole of the component collective in a state where the projection is fitted into the hole.

Nevertheless, an opening/closing means 58 shown in FIG. 13 can be employed in the present fourth embodiment and serve both as the opening means and as the closing means for the component collective A. Since the opening/closing means 58 is positioned at the take-out position P, opening of the lids 7, removal of the component 3, and closing of the lids 7 are totally carried out when the component holder 1 is at the take-out position P. This is a second feature of the fourth embodiment.

In FIGS. 11–13, a hook 20 of an inverted L-shaped in cross section is integrally formed at the upper surface of each lid 7. The inner side of the hook 20 is open. An L-shaped moving body 58a is provided for the right and left opening/closing means 58 located above the component holder 1 at the take-out position P. The hook 20 is engaged with the L-shaped moving body 58a, thereby opening/closing the lid 7.

A pair of guide wheels 58b at the upper end of the L-shaped moving body 58a are guided along a circular arc guide groove 58c. The center of the guide groove 58c is located at the hinge portion 13 of the lid 7. A projecting element 58d integrally formed with the L-shaped moving body 58a has a long hole 58e into which a front end of a rod 58g of an air cylinder 58f is fit. Therefore, when the air cylinder 58f operates, the L-shaped moving body 58a is moved between a closing position C' and an opening position O' indicated in FIG. 13.

While the lids 7 are opened and closed by the action of the air cylinder 58f of the opening/closing means 58, the component 3 in the component holder 1 at the take-out position P is removed.

The fourth embodiment is the same in structure as the first through third embodiments except with respect to the above-described first and second features, and therefore the detailed description will be abbreviated.

A fifth embodiment of the present invention will be described with reference to FIGS. 14–16 and 18–19.

The fifth embodiment has a single lid 7, rather than two lids. Hinge portions 13 of the lid 7 are formed in a direction orthogonal to the longitudinal direction of the component collective A. The resin spring 8c is similar to that of the fourth embodiment and a pair of right and left flaps 31 are integrally formed with the lid 7 for use in forcibly opening the lid 7. Since the fifth embodiment is constructed in the same manner as the other embodiments except for the above points, further description thereof will be omitted.

Figure 18:
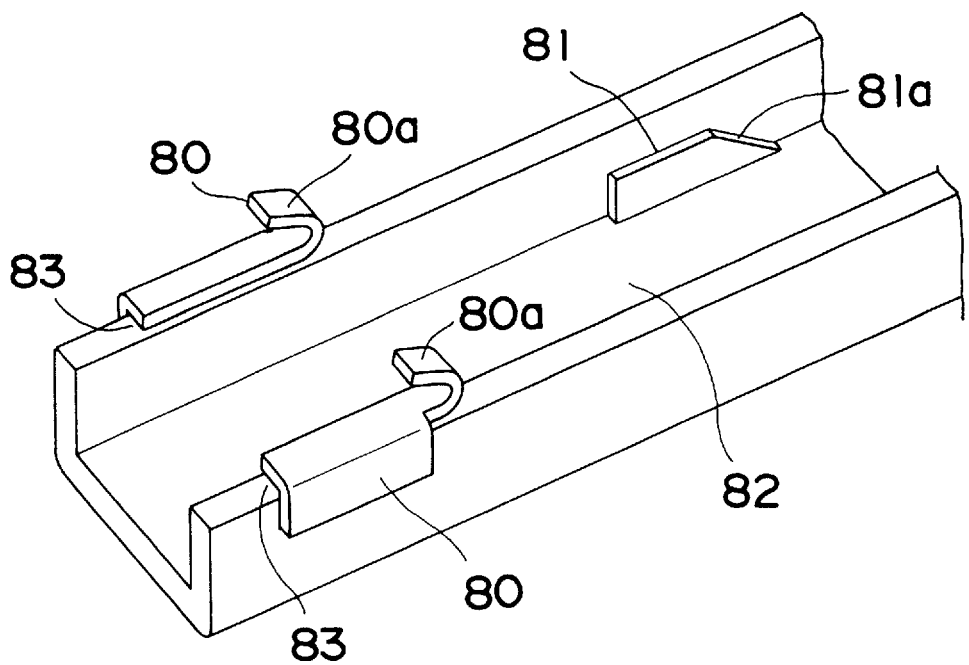
FIG. 18 is a perspective view of guides for opening and closing a lid in the fifth embodiment.
Figure 19:
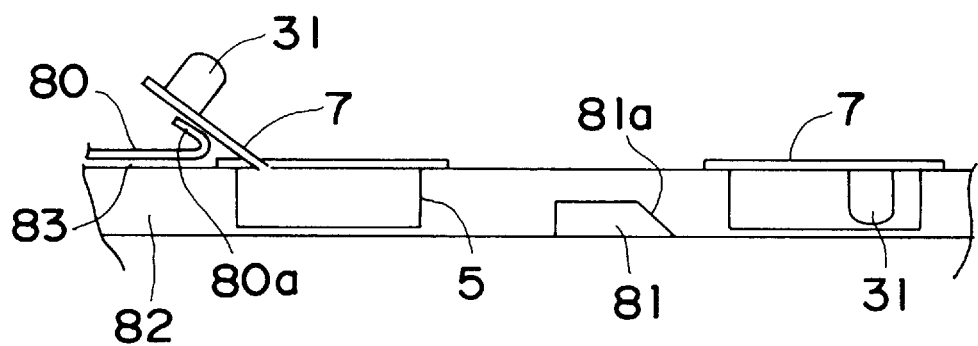
FIG. 19 is a side view of the guides in FIG. 18.

In the fifth embodiment, as shown in FIG. 18, in a case where the component collective A is transferred along a transfer path 82 having a C-shaped section, inclined guides 81 are properly arranged at the insides of both side walls of the path 82 and guide the flaps 31 up by inclined surfaces 81a of the inclined guides 81 with the component collective A transferred in increments, whereby the lid 7 is opened. Moreover, J-shaped guides 80 are arranged on upper surfaces of the side walls of the path 82 while a small gap 83 is formed between the lower surface of each of the guides 80 and the upper surface of each of the side walls of the path 82. The guides 80 have inclined surfaces 80a to guide the opened lid 7 in a direction to close the lid 7. That is, with the transfer of the component collective A along the path 82, the inclined surfaces 80a come into contact with both sides of the opened lid 7 as shown in FIG. 19 and then cause the lid 7 to be rotated and closed, so that the closed lid 7 is passed through the gap 83, thereby ensuring that the lid 7 is closed.

The present invention may be modified in various other ways. For example, the characteristic features of any one of the embodiments may be combined with another embodiment to execute the invention.

As described hereinabove, the component collective A of the invention allows for the reuse of the tape carrier after the components are removed, and thus exhibits superior cost-performance. Further, the component collective A prevents the component in the component holder from being damaged and protects against dust. The component collective A helps to make the feeding apparatus compact.

The feeding apparatus of the invention is suitable for feeding the above-discussed advantageous component collective.

Although the present invention has been fully described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims unless they depart therefrom.

What is claimed is:

1. A component collective comprising component holders respectively holding components therein and connected to one another in a form of a tape carrier; each of the component holders being provided with a cavity to accommodate one of the components, a lid means for shutting an opening of the cavity, and a keeping means for keeping the lid means at a closed position.

2. The component collective according to claim 1, wherein the lid means has double lids opening outward and arranged symmetric to a center line in a longitudinal direction of the component collective.

3. The component collective according to claim 1, wherein the lid means comprises a one piece lid having hinge portions formed in a direction orthogonal to a longitudinal direction of the component collective.

4. The component collective according to claim 1, wherein the component holder is an integral resin molding and the lid means has a hinge portion formed of a thin resin.

5. The component collective according to claim 2, wherein the component holder is an integral resin molding and the lid means has a hinge portion formed of a thin resin.

6. The component collective according to claim 3, wherein the component holder is an integral resin molding and the lid means has a hinge portion formed of a thin resin.

7. The component collective according to claim 1, wherein the keeping means is constituted of projecting/recessed engaging parts formed between side faces of the lid means and the cavity.

8. The component collective according to claim 2, wherein the keeping means is constituted of projecting/recessed engaging parts formed between side faces of the lid means and the cavity.

9. The component collective according to claim 3, wherein the keeping means is constituted of projecting/recessed engaging parts formed between side faces of the lid means and the cavity.

10. The component collective according to claim 4, wherein the keeping means is constituted of projecting/recessed engaging parts formed between side faces of the lid means and the cavity.

11. The component collective according to claim 4, wherein the keeping means is integrally formed with the component holder and constituted of resin springs which maintain the lid means in an opened state when the lid means moves in an opening direction beyond a turning point, while keeping the lid means in a closed state when the lid means passes the turning point in a closing direction.

12. The component collective according to claim 5, wherein the keeping means is integrally formed with the component holder and constituted of resin springs which maintain the lid means in an opened state when the lid means moves in an opening direction beyond a turning point, while keeping the lid means in a closed state when the lid means passes the turning point in a closing direction.

13. The component collective according to claim 6, wherein the keeping means is integrally formed with the component holder and constituted of resin springs which maintain the lid means in an opened state when the lid means moves in an opening direction beyond a turning point, while keeping the lid means in a closed state when the lid means passes the turning point in a closing direction.

14. The component collective according to claim 1, wherein the component holders are formed separately and are connected to one another at projecting/recessed coupling parts.

15. The component collective according to claim 2, wherein the component holders are formed separately and are connected to one another at projecting/recessed coupling parts.

16. The component collective according to claim 3, wherein the component holders are formed separately and are connected to one another at projecting/recessed coupling parts.

17. The component collective according to claim 4, wherein the component holders are formed separately and are connected to one another at projecting/recessed coupling parts.

18. The component collective according to claim 7, wherein the component holders are formed separately and are connected to one another at projecting/recessed coupling parts.

19. The component collective according to claim 11, wherein the component holders are formed separately and are connected to one another at projecting/recessed coupling parts.

\* \* \* \* \*